US009910117B2

(12) United States Patent
Fenchel et al.

(10) Patent No.: US 9,910,117 B2
(45) Date of Patent: Mar. 6, 2018

(54) METHOD AND APPARATUS TO GENERATE MAGNETIC RESONANCE IMAGE DATA OF AN EXAMINATION SUBJECT

(71) Applicant: Siemens Aktiengesellschaft, Munich (DE)

(72) Inventors: Matthias Fenchel, Erlangen (DE); David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 925 days.

(21) Appl. No.: 14/314,254

(22) Filed: Jun. 25, 2014

(65) Prior Publication Data
US 2014/0375316 A1    Dec. 25, 2014

(30) Foreign Application Priority Data

Jun. 25, 2013 (DE) ........................ 10 2013 212 084

(51) Int. Cl.
*G01V 3/00* (2006.01)
*G01R 33/48* (2006.01)
*G01R 33/565* (2006.01)

(52) U.S. Cl.
CPC ..... *G01R 33/4816* (2013.01); *G01R 33/4824* (2013.01); *G01R 33/56572* (2013.01)

(58) Field of Classification Search
CPC .................................................. G01R 33/4816
USPC ................................. 324/309, 307, 306, 314
See application file for complete search history.

(56) References Cited

U.S. PATENT DOCUMENTS

| 8,120,358 B2 * | 2/2012 | Du ..................... G01R 33/4824 324/309 |
| 8,386,013 B2 * | 2/2013 | Du ..................... G01R 33/4824 324/307 |
| 9,234,951 B2 * | 1/2016 | Grodzki ........... G01R 33/56572 |
| 9,594,146 B2 * | 3/2017 | Weng .................. G01R 35/005 |

(Continued)

OTHER PUBLICATIONS

Atkinson et al., "Characterization and Correction of System Delays and Eddy Currents for MRI Imaging with Ultrasound Echo-Time and Time-Varying Gradients," Magnetic Resonance in Medicine, vol. 62 (2009), pp. 532-537.

(Continued)

*Primary Examiner* — Louis Arana
(74) *Attorney, Agent, or Firm* — Schiff Hardin LLP

(57) ABSTRACT

In the magnetic resonance image data acquisition and apparatus, raw magnetic resonance data are acquired at multiple points along a trajectory in k-space from first and second magnetic resonance echo signals caused by a radio-frequency excitation pulse. The course of the trajectory in k-space is established by adjusting a magnetic field value of a gradient magnetic field. The gradient magnetic field has a field value of a first point in time of the trajectory curve and a subsequently modified and at a layer second point in time, the gradient magnetic field has the same field value as that said first point in time. The second point in time is before or during the acquisition of the raw magnetic resonance data of the first magnetic resonance echo signal. The shift value for the trajectory is determined and the trajectory is shifted according to this shift value, and an image is reconstructed from the shifted raw magnetic resonance data of the trajectory.

15 Claims, 7 Drawing Sheets

(56) References Cited

U.S. PATENT DOCUMENTS

2012/0313640 A1* 12/2012 Pfeuffer ............... A61B 5/055
324/309
2013/0154641 A1 6/2013 Grodzki

OTHER PUBLICATIONS

Park et al., "Short Echo-Time 3D Radial Gradient-Echo MRI Using Concurrent Dephasing and Excitation," Magnetic Resonance in Medicine, vol. 67 (2012), pp. 428-436.
Kramer et al., "Robust estimation of true k-space center position for radial center-out trajectories," Proc. Intl. Soc. Reson. Med., vol. 21 (2013), p. 3785.
Takizawa et al., "A Robust Ultrashort TE (UTE) Imaging Method With Corrected k-Space Trajectory by Using Parametric Multiple Function Model of Gradient Waveform," IEEE Transactions on Medical Imaging, vol. 32 (2013), pp. 306-316.
Margosian et al., "Practical Implementation of UTE Imaging," eMagRes MRI NMR, vol. 1 (2012), pp. 297-309.

* cited by examiner

METHOD AND APPARATUS TO GENERATE MAGNETIC RESONANCE IMAGE DATA OF AN EXAMINATION SUBJECT

BACKGROUND OF THE INVENTION

Field of the Invention

The present invention concerns a method to generate magnetic resonance image data of an examination subject with the use of a magnetic resonance imaging system, and a magnetic resonance imaging system for implementing such a method.

Description of the Prior Art

Imaging systems that are based on magnetic resonance measurement (of nuclear spins), known as magnetic resonance tomography systems have been successfully established and proven through numerous applications. In this type of image acquisition, a static basic magnetic field B0 that serves for initial alignment and homogenization of magnetic dipoles to be examined is superimposed with a rapidly switched magnetic field (known as the gradient magnetic field) for spatial resolution of the imaging signal. To determine the material properties of an examination subject to be imaged, the dephasing or relaxation time after a deflection of the magnetization out of the initial alignment is determined so that different relaxation mechanisms or relaxation times typical to the material can be identified. The deflection typically takes place by radiating a number of RF pulses, and the spatial resolution is based on a temporally fixed manipulation of the deflected magnetization with the use of the gradient magnetic field by activation of gradient pulses in a measurement sequence, which establishes a precise chronological sequence of RF pulses, gradient pulses and the acquisition of measurement values.

If a switching sequence of the gradient magnetic field in a measurement sequence is delayed relative to an expected point in time of the switching, this leads to inaccuracies in the spatial resolution of the magnetic resonance signal that cause distortions and other errors in the magnetic resonance imaging of an examination subject. This delay is designated as a "switching lag" in the following.

An association between measured magnetization (from which the mentioned material properties can be derived) and a spatial coordinate of the measured magnetization typically takes place with the aid of an intermediate step. In this intermediate step, acquired raw magnetic resonance data are entered into a memory in an organization known as "k-space", wherein the coordinates of k-space are coded as a function of the gradient magnetic field. The gradient magnetic field varies the resonance frequency (Larmor frequency) and, for example, also the phase position of the magnetization deflected by an RF pulse in a spatially dependent manner, such that spatial information in k-space is obtained by the designation of phase position and resonance frequency of the measured magnetization. Thus k-space is also known as the frequency domain. In other words, spatial information is based, with phase coding and frequency coding, on the coordinate system of k-space (spatial frequency) and is defined as a function of the gradient magnetic field. The magnitude of the magnetization (in particular of the transverse magnetization, defined in a plane transversal to the previously described basic magnetic field) at a defined location of the examination subject can be determined from the readout point in k-space with the use of a Fourier transformation, with which the signal strength of the signal in the spatial domain can be calculated from the signal strength (magnitude of the magnetization) that is associated with a defined frequency (the spatial frequency).

K-space thus forms an inverse Fourier space relative to positional space of the examination subject, such that the magnetic resonance signals are transformed into the positional space with the aid of a Fourier transformation to create the magnetic resonance image. The gradient magnetic field thus determines a point in k-space, wherein the time curve of the gradient magnetic field establishes a series of k-space points, which can be designated as what is known as the "trajectory" through k-space or also as a "projection".

The aforementioned switching lag can disadvantageously reach an order of microseconds in present magnetic resonance imaging systems, and therefore markedly exceed the switching delay of an RF pulse for the deflection of the magnetization. If this is the case, the gradient magnetic field assumes a value other than the one expected at a readout point of the raw magnetic resonance data, and a gradient magnetic field or a phase position of the spins that corresponds to an expected k-space coordinate is only achieved at a later point in time. It results from this that the measured magnetic resonance signal is associated with a displaced coordinate in k-space, since the gradient magnetic field or the required phase position of the spins does not have the expected value at the point in time of measurement.

If a displacement of the k-space coordinates of the trajectory occurs due to the switching lag so that an approximately coherent displacement (explained in detail later) is present for all trajectories—for example given line-by-line Cartesian scanning of k-space—the switching lag has nearly no effect on the quality of the imaging of the examination subject since the additionally created phase or frequency shift is the same for all k-space points. However, if this is not the case—for example if the scanning of k-space is selected in a particular path through k-space and takes place radially, for example—this inevitably leads to severe artifacts in the imaging. In this case, a correction of the k-space points of the trajectories should take place in order to be able to implement a transformation of the magnetic resonance signals into positional space of the examination subject while avoiding distortions and image artifacts.

The switching lag is particularly problematic given image data that are determined with the use of known "UTE sequences" (U=ultrashort, TE=echo time). An echo signal of the magnetization which should be detected thereby occurs after an "ultrashort time" (i.e. after an echo time TE1 of between 5 µs and 200 µs) after emission of an RF pulse. The detection of magnetic resonance signals given the UTE sequences therefore typically takes place with trajectories that travel outward radially from the origin point of k-space to the boundaries of scanned k-space (what are known as "half projections"), since the echo time TE1 is not sufficient in order to start a trajectory from a border region of k-space, for example. The switching delay given the acquisition of half projections is disadvantageously such that significant portions of the magnetic resonance signals can only be imprecisely associated with a spatial frequency due to the short time sequence between excitation and signal acquisition. The switching lag thus leads to particularly severe artifacts in image reconstruction.

In order to improve the association of magnetic resonance signals with spatial frequencies, a method for correction is known that corrects the k-space points of the trajectories with the aid of a correction value. The correction value is added to the correction method via input, wherein the input can take place manually or also from a database, for example. However, this method is time-consuming or based on general models for the displacement due to the switching lag, such that significant effort arises in the acquisition of the magnetic resonance imaging, and moreover the correction no longer takes place optimally.

SUMMARY OF THE INVENTION

An object of the present invention is to provide a method to generate magnetic resonance image data of an examination subject, as well as a corresponding reconstruction device and a magnetic resonance imaging system, that avoid the disadvantages described above, in particular with regard to UTE sequences.

According to the invention, the following method is disclosed for generating magnetic resonance image data of an examination subject.

An initial step of this method includes the emission of a radio-frequency excitation pulse ("RF pulse"), in particular to excite magnetic resonance signals in an examination subject (i.e. to generate a magnetic resonance echo signal). The generated magnetic resonance echo signal should in particular occur after the "ultrashort echo time" established in the preceding.

In a subsequent step, the acquisition of raw magnetic resonance data of the examination subject takes place in k-space, wherein the raw magnetic resonance data include measurement values at multiple readout points. The readout points are thereby arranged along one or more different trajectories in k-space. The acquisition of the raw magnetic resonance data thereby in particular concerns the acquisition and direct processing of raw magnetic resonance data. The raw magnetic resonance data include measurement values of a chronologically first magnetic resonance echo signal which is caused by the emitted radio-frequency excitation pulse. As mentioned, the trajectories are thereby to be understood as a series of k-space points in the order of the temporal and spatial gradient magnetic field curve, such that each point of the trajectory includes associated measurement values of a magnetic resonance signal. Each k-space point of the trajectory with its associated measurement value can thus also be designated as a "readout point".

As noted, in particular the time curve of the trajectory in k-space can be determined by establishing a magnetic field value of a gradient magnetic field. The magnetic field value considered in the following defines the gradient magnetic field (advantageously in the frequency coding direction and/or phase coding direction), in particular a value of the gradient magnetic field that occurs at a specific location in measurement space of a magnetic resonance imaging system (i.e. what is known as the homogeneity volume) at a specific time, in particular via superposition of the magnetic field components of the gradient magnetic field in the frequency coding direction and phase coding direction. For example, for the sake of simplicity a current can be considered through the gradient coils that advantageously generate the gradient magnetic field in the frequency coding direction and phase coding direction. In this case, a consideration of the values of the individual currents should be resorted to, and a first magnetic field value is only identical to a second magnetic field value when the currents through the coils for the frequency coding direction coincide for the first and second magnetic field value and the currents through the coils in the phase coding direction respectively do so as well.

In the time curve of the trajectory according to the invention—in particular after emission of the radio-frequency excitation pulse—the gradient magnetic field has a first magnetic field value at a first point in time.

The magnetic field value (and therefore the gradient magnetic field) is subsequently modified relative to the first magnetic field value.

At a later, second point in time, the gradient magnetic field has a first magnetic field value that is identical to that at the first point in time. According to the invention, the second point in time lies before and/or during the acquisition of measurement values of the first magnetic resonance echo signal. This means that what is known as a "pre-dephasing" is implemented between [sic] the first occurrence of a first point in time (for which a corresponding second point in time can be determined) in the time curve of the trajectory; a partial region of a trajectory in k-space is thus already scanned. This means that the first point in time (and therefore the first switching procedure of the gradient magnetic field) lies before the expected occurrence of the first magnetic resonance echo signal. The "first" switching procedure thereby in particular refers to the time period after the emission of the radio-frequency excitation pulse, and is advantageously to be considered without any slice selection gradient at all.

It can thus also be ensured that a defined magnetic field value to control the curve of the trajectory in k-space is achieved, and the switching lag occurs chronologically before the acquisition of essential portions of the first magnetic resonance echo signal. This enables that a precise location in frequency space can also be associated with essentially all measurement signals that can be associated with a first magnetic resonance signal, and optimally no spatial overlapping of multiple readout points of a trajectory occurs.

The first magnetic field value can be a "zero" value, meaning that the magnetic field value can have multiple "zero crossings" and in particular experience a polarity change after one of the zero crossings. In the time curve of the magnetic field value immediately after a zero crossing or second point in time, the magnetic field value can preferably lie in a range that does not occur in the time period between two "zero crossings" or between the first point in time and the second point in time. An approach to the origin point of k-space can thereby take place, such that the typical scanning of the first magnetic resonance echo signal can subsequently be sought again in the form of half projections, for example.

In a further step of the method, the determination of a displacement value (also called an "offset") takes place for the trajectory on the basis of the measurement values of said trajectory. The advantageous effect is that the switching lag does not temporally overlap with the acquisition of the measurement data of the first magnetic resonance echo signal, such that measurement values of the first magnetic resonance echo signal can be acquired over a full half projection starting from the k-space center, as this will be explained in more detail in the following.

The method also concerns a shifting or displacement of readout points of the raw magnetic resonance data by the shifting value along their respective trajectories. In an embodiment, all readout points of the raw magnetic resonance data are shifted.

In a further step of the method, the magnetic resonance image data are reconstructed on the basis of the shifted or corrected raw magnetic resonance data.

The shifting value can be determined by calculation or enumeration of values of the respective trajectory and/or multiple trajectories or, respectively, measurement values of the readout points arranged thereon, wherein the values or measurement values can in particular include magnetization data, minimum values, maximum values, coordinates in k-space, ranking in an order and the like.

If a correction of the readout points according to the invention takes place before or during a transformation of the raw magnetic resonance data into the positional space of the examination subject, image errors can thus be avoided, wherein a significantly improved image quality and markedly more homogeneous intensity distribution can be achieved via the determination of a displacement value on the basis of the readout points on the trajectories, in particular given UTE measurement methods.

The invention also concerns a magnetic resonance imaging system that is designed to operate according to the method according to the invention. The magnetic resonance imaging system has a measurement control unit that controls a scanner of the magnetic resonance imaging system according to a predetermined measurement protocol to implement a measurement. The measurement control unit is connected with or includes a memory device in which a control protocol is stored that implements the control of the magnetic resonance imaging system according to the method according to the invention. A reconstruction device of the magnetic resonance imaging system can be arranged at an arbitrary location, which reconstruction device implements a reconstruction according to the invention.

A majority of the aforementioned components of the magnetic resonance imaging system (for example a measurement control unit and/or the reconstruction device) can be realized wholly or in part in the form of software modules in a processor of a computer system, in particular of the magnetic resonance imaging system.

A realization of measurement control unit and/or reconstruction device largely in software has the advantage that magnetic resonance imaging systems or, respectively, control devices or reconstruction devices that have already previously been in use can also be retrofitted simply via a software update in order to operate in the manner according to the invention. The present invention also encompasses a non-transitory, computer-readable data storage medium encoded with programming instructions that, when the storage medium is loaded into a computerized control and evaluation system of a magnetic resonance imaging apparatus, and the programming instructions are executed by the control and evaluation system, cause the magnetic resonance imaging apparatus to be operated in accordance with any or all of the embodiments of the invented method described above.

As noted, the magnetic field value can have one or more "zero crossings", and can thereby experience a polarity change after one of the zero crossings. An approach to the origin point of k-space can take place. In an embodiment of the method, the trajectory has a segment that is traversed repeatedly before and/or during the acquisition of measurement values of the first magnetic resonance echo signal. In the repeatedly traversed segment, the continuation of a half projection is preferably followed exactly, in which half projection are arranged readout points for measurement values of the first magnetic resonance echo signal. A reversal of direction of the trajectory is thereby only implemented within the scope of the pre-dephasing.

For example, it is thus possible that—in spite of switching lag—the occurrence of the first signal approximately coincides with the traversal of the k-space center. A gradient moment is therefore preferably zero before and/or during the acquisition of measurement values of the first magnetic resonance echo signal, as considered from the point in time of the first variation of the gradient magnetic field or of the magnetic field value. This means that the center of k-space is preferably traversed during the pre-dephasing, before and/or during the acquisition of measurement values of the first magnetic resonance echo signal. The possibility thus exists to minimize the occurring artifacts solely via the control of the pre-dephasing, preferably under consideration of a typical switching lag. Models or manufacturer values regarding typical switching lag values can thereby be used. In contrast to the prior art, these models or manufacturer values are not used first in the retroactive displacement of the readout points, but rather are already used in the acquisition of the raw magnetic resonance data.

In particular, the zero point of the gradient moment can coincide with the first achievement of a defined (preferably local) extreme value of the magnetic field value. This in particular has the advantage that eddy currents caused by the change of the gradient magnetic field can be minimized during the acquisition of the first magnetic resonance echo signal.

For example, this can be improved by the magnetic field value proceeding in a constant manner after reaching the extreme value (in particular immediately after this). The magnetic field value is preferably constant during the entire subsequent duration of acquisition of measurement data of the first magnetic resonance echo signal, and corresponds to the magnetic field value during the acquisition of measurement data of an extreme value (advantageously a maximum value) of the first magnetic resonance echo signal. A readout point on a trajectory that has an extreme value relative to the measurement values along the trajectory can be designated as an "extreme point". In the following, a readout point on the trajectory that has a maximum value relative to the measurement values will accordingly be designated as a "maximum point".

The beginning of the acquisition of measurement values at the readout points preferably lies at or after the achievement of an extreme value of the magnetic field value. In particular, the beginning of the acquisition of measurement values can take place after the occurrence of the turning point in the magnetic field value. This means that the measurement values of the first magnetic resonance echo signal in particular are acquired given a short pre-dephasing given a monotonous change of the magnetic field value.

The "short pre-dephasing" or the word "short" in this context refers to the fact that the length of the trajectory in k-space from a first occurrence of the first point in time (i.e. the first point in time at which a second point in time can be determined for an arbitrary magnetic field value) up to the second point in time corresponds to a maximum of 25% of the length of the trajectory for the acquisition of the first magnetic resonance echo signal; this means that the pre-dephasing is short relative to the "readout time" or, respectively, the length of the "readout window" of the first magnetic resonance echo signal. The length of the trajectory can in particular be determined by the interval of a maximum magnitude of a k-value for a readout point of the first magnetic resonance echo signal and the k-space center ("length of the half projection"). In order to ensure that the maximum point does not exhibit too great a distance from the k-space center, and therefore that the displacement of the readout point does not unnecessarily surpass the order of magnitude of the switching lag, the length of the trajectory from the first occurrence of the first point in time up to the second point in time is at most 10% of the length of the trajectory for acquisition of the first magnetic resonance echo signal.

As noted, a "maximum point" can be determined for the trajectory, which "maximum point" that has a maximum value relative to the measurement values along this trajectory. The displacement al can then preferably be determined by counting or, respectively, calculation on the basis of the maximum point. For example, maximum values can include the magnetization, the change of the magnetization, the strength of a magnetic resonance signal or, respectively, the change of a magnetic resonance signal or the like. The maximum values thereby represent an example of a characteristic reference value, meaning that the maximum points form reference points that allow a synchronization of the spatial frequency of the measurement points on the trajectories. A distinct determination of an optimal displacement value is thus enabled.

In particular, multiple maximum points can thereby be determined for multiple first magnetic resonance echo signals that are then arranged on trajectories with different curves in k-space. This means that there is a family of trajectories.

An embodiment of the invention concerns a method to generate magnetic resonance image data of an examination subject, wherein the noted steps
  emit a radio-frequency field,
  control the time curve of the trajectory according to the above explanations,
  acquire raw magnetic resonance data and
  determine a displacement value
are implemented for a family of multiple trajectories, and the displacement value used to shift readout points of the raw magnetic resonance data is determined on the basis of the shift values determined for the family of trajectories.

In a preferred variant, for at least one of the trajectories, the shift value can be established on the basis of a combination of the maximum points of the family of trajectories as well as a target point, such that the synchronization of the spatial frequency takes place relative to an established reference value. In particular, the target point can be arranged on the respective trajectory. Moreover, it is also for the establishment of a target point on the respective trajectory to take place by mapping of a common target point of all trajectories in the respective trajectory.

The target point for at least one of the trajectories is preferably established on the basis of a relative position of the readout points along the respective trajectory, for example relative to a start point of the respective trajectory. For example, the respective position of the readout points can be determined relative to a start point of the respective trajectory by counting down the order of the readout points along the respective trajectory.

A shift value can be determined particularly preferably and in a particularly simple manner if the readout points are arranged on their respective trajectory according to a rule, in particular are equally spaced (i.e. are arranged in a fixed spacing on the trajectories). If a common rule is applied for the readout points on different trajectories, k-space can be said to be scanned symmetrically.

In a further preferred variant, a target point can be established on the basis of a combination of values of the cohort of trajectories (for example the maximum points of the cohort of trajectories) to define or determine the shift value for at least one of the trajectories.

Shift values can particularly advantageously be determined or calculated from the intersection points of the trajectory with a target point that corresponds to the origin coordinate of k-space.

In particular, the realization can be utilized that the maximum value of the measurement values along the trajectory can normally be associated with the intersection point of the trajectory with the target point, which can represent an origin coordinate of k-space. For example, the target point can be provided in that the magnetization was not affected in at least one dimension of k-space by the gradient magnetic field, thus that a gradient magnetic field or a gradient moment of zero exists, wherein this point conventionally coincides with the origin of underlying k-space.

The maximum values of the measurement values can consequently essentially represent the intersection points of the trajectories with an origin coordinate of k-space in this dimension, wherein the formulation "essentially represent the intersection points" includes a deviation that is defined by a spacing of the readout points of the trajectory in k-space. This spacing can be defined according to the Nyquist-Shannon sampling theorem, for example, wherein the limit frequency of the Nyquist-Shannon consideration is associated with the highest spatial frequency of k-space.

In the method, a shift value can preferably be calculated for at least one of the trajectories on the basis of a difference between the target point and a combination of the maximum points of the family of trajectories. The shift value can in principle be an individual, trajectory-dependent shift value. However, a common shift value is particularly preferably determined for all trajectories.

For at least one of the trajectories, an individual, trajectory-dependent displacement value can likewise be established on the basis of a difference between a target point (advantageously a jointly determined target point as explained above) and the maximum point of the appertaining trajectory.

A common shift value for all trajectories can thus be determined; however, the individual determination of a shift value can also respectively be provided for the individual trajectories.

The combination of the maximum points to determine the shift value and/or the target point can take place by the calculation of a mean value of the maximum points of the family of trajectories, for example. It can be a mean value that is calculated from the relative position of the maximum points on their respective trajectories.

A shift value or a target point that can respectively be applied to shift all readout points can thus very simply be determined on the basis of a mean value with the use of the family of trajectories.

For example, the mean value can also be a mean value of the k-space coordinates of the maximum points, or also an arithmetic or geometric mean value that is determined on the basis of the maximum points, such that a simple establishment of common reference values of the displacement can take place.

The shift of the k-space coordinates by the shift value preferably already takes place at least in part during the acquisition of additional raw magnetic resonance data so that an acceleration of the generation of magnetic resonance image data can be achieved.

This acceleration can be assisted in an embodiment of the invention. For example, k-space can be filled with additional raw data on the basis of the acquired raw magnetic resonance data, and the displacement of the k-space coordinates by the displacement value can take place before or during the filling of k-space. The additional raw data can include or be formed by virtual raw magnetic resonance data (which are determined with the use of an interpolation or extrapolation method).

The interpolation or extrapolation method can preferably be a gridding method. A gridding method, as is known, describes a filling of k-space in a predetermined grid with calculated raw magnetic resonance data that are derived from the measurement values. Incorrect associations of measurement values with coordinates of k-space thereby lead to an incorrect interpolation or, respectively, extrapolation, such that a correction of the readout points by the displacement value particularly reasonably takes place before or, respectively, during the gridding method.

DESCRIPTION OF THE PREFERRED EMBODIMENTS

Figure 1:
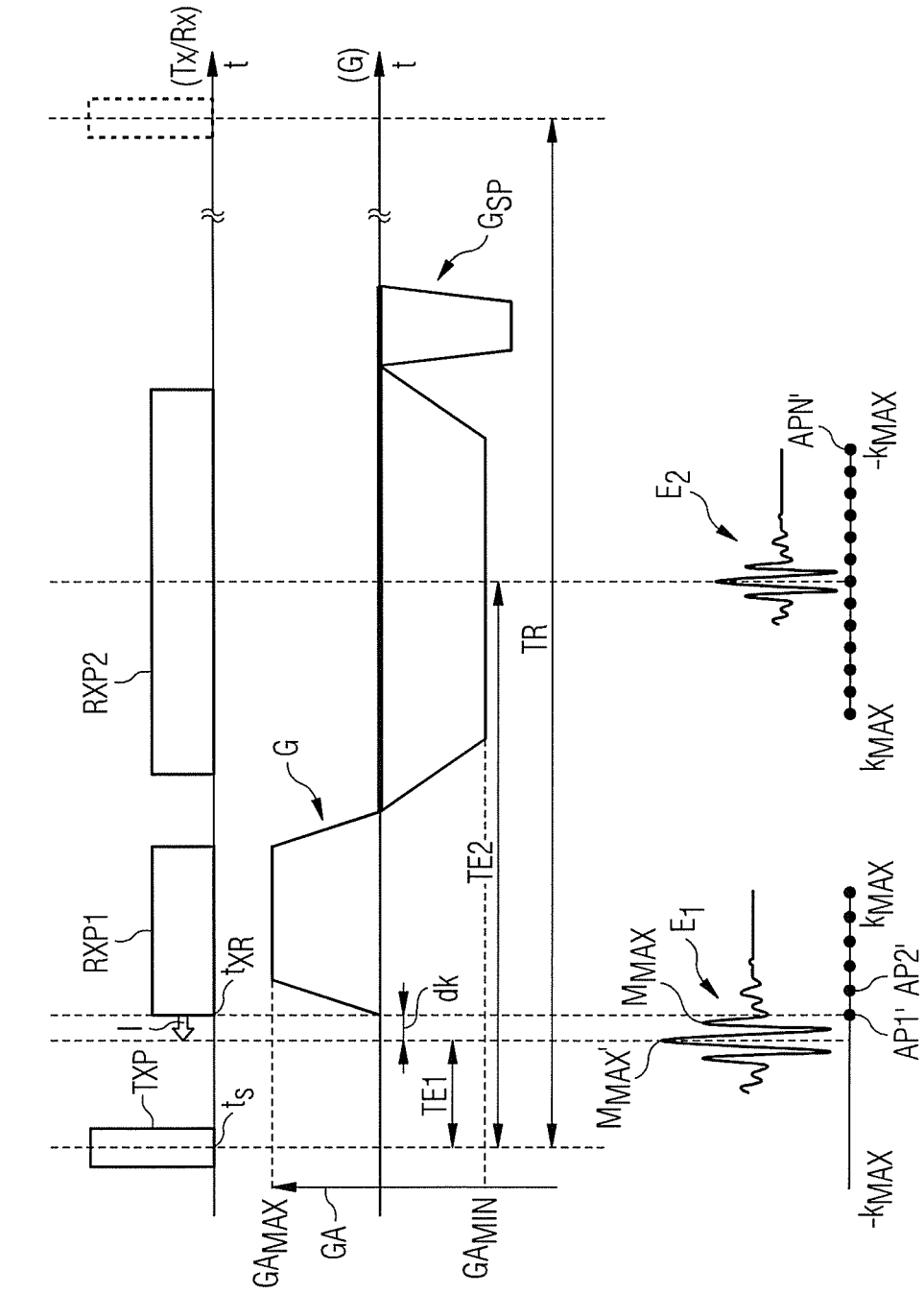
FIG. 1 is a schematic sequence diagram for a typical curve of a UTE sequence according to the prior art.

FIG. 1 schematically shows a sequence diagram with the time curve of what is known as a UTE sequence according to the prior art, thus a control sequence for a magnetic resonance imaging system to acquire first magnetic resonance echo signals $E_1$ that occur after an ultrashort echo time TE1. The time curve of the transmission of magnetic resonance signals in multiple readout windows RXP1, RXP2 is thereby shown on an upper time axis (TX/RX axis). On an additional time axis (G-axis) located below this, the time curve of a gradient magnetic field G is explained using a magnetic field value GA. In particular, the curve of the magnetic field value GA is shown as example, which curve represents the field strength of the gradient magnetic field G in what is known as the frequency coding direction (which is designated as the x-direction). In the shown case, the magnetic field value is the current through a gradient coil that generates a gradient magnetic field $G_x$ in the frequency coding direction. The gradient magnetic field $G_y$ in the phase coding direction is thereby zero (i.e. is constant).

The magnetic resonance echo signals $E_1$, $E_2$ that are generated and occur due to the radio-frequency excitation pulse TXP, and the readout points AP1', AP2', ..., APN' that are acquired along a single trajectory for these echo signals $E_1$, $E_2$, are shown coordinated in time in a further sub-segment of the diagram. Beyond the presentation, the readout of magnetic resonance signals takes place with a denser series of readout points AP1', AP2', ..., APN' that at least satisfies the Nyquist-Shannon sampling theorem.

A radio-frequency excitation pulse TXP to excite magnetic resonance signals in an examination subject is thereby emitted, centered on a transmission point in time $t_s$. After the expected echo time TE1 of the first magnetic resonance echo signal E1, the readout of the magnetic resonance signals is begun. For this, the gradient magnetic field value GA is controlled in order to scan a trajectory in k-space.

However, due to a switching lag dk the activation of the gradient magnetic field takes place with a time delay. As is likewise apparent in FIG. 1, this leads to the situation that measurement values—in particular of a first magnetic resonance echo signal $E_1$—are associated with readout points AP1', AP2' on the trajectory whose k-values do not correspond to the expected control of the gradient magnetic field, such that the time delay can be directly translated into a displacement dk of the readout points in k-space on the trajectory. As is indicated by the arrow I, the measurement values are associated with k-space points that correspond to the point in time of switching without switching lag.

It is also the case that magnetic resonance measurement signals that have been acquired during the switching lag dk of the gradient magnetic field G cannot be correspondingly resolved in the spatial domain, such that a readout of magnetic resonance signals can only be discussed if a gradient magnetic field G is activated. This is indicated schematically in FIG. 1 by the beginning of the readout at point in time $t_{xr}$ coinciding with the actual activation of the gradient magnetic field G.

This means that, in spite of the actual intended activation of the gradient magnetic field at the point in time of the expected first signal (thus the echo time TE1 of the first magnetic resonance echo signal E1), the maximum value (i.e. a maximum point) is not detected since the gradient magnetic field is not activated at this point in time.

As can furthermore be seen in FIG. 1, the first magnetic resonance echo signal $E_1$ is scanned by controlling the gradient magnetic field value GA at a maximum value $GA_{MAX}$ over the course of a half projection. This means that measurement values of the first magnetic resonance signal are acquired starting from the k-space center, offset by the switching lag dk. The measurement values are associated with readout points AP1', AP2', ... that—starting from the k-space center—extend to a border region of k-space for the first magnetic resonance echo signal $E_1$. The border region of k-space is thereby described by the k-space value $k_{MAX}$ with regard to the scanned trajectory which has a maximum magnitude. Measurement signals of the first magnetic resonance echo signal $E_1$ are acquired in this half projection.

After reaching the border region of k-space, the gradient magnetic field value GA is modified to a minimum value GAmin, and the trajectory in k-space continues—starting from the border region, which in this case is described by a maximum k-space value $k_{MAX}$—to a minimum k-space value $-k_{MAX}$, i.e. the opposite border region. In the continuation of the trajectory, the occurrence of a chronologically second magnetic resonance echo signal $E_2$ falls after the echo time TE2 which was excited by the radio-frequency excitation pulse TXP. For this second magnetic resonance echo signal $E_2$, measurement values are likewise acquired that are associated with readout points on the trajectory. The trajectory thus has N readout points, wherein the chronologically last readout point is designated with APN'. As is furthermore shown, a gradient known as a spoiler pulse $G_{SP}$ follows the readout of the first and second magnetic resonance echo signal $E_1$, $E_2$, in which spoiler pulse $G_{SP}$ the magnetization generated in the examination subject by the excitation pulse TXP is neutralized again by switching the gradient magnetic field G. The acquisition of this trajectory is therefore terminated within what is known as a repetition time TE. In the subsequent repetition of the sequence, the gradient magnetic field value GA is varied so that a different trajectory in k-space is scanned. For example, the gradient magnetic field G can be varied in the phase coding direction and can be constant in the frequency coding direction.

Figure 2:
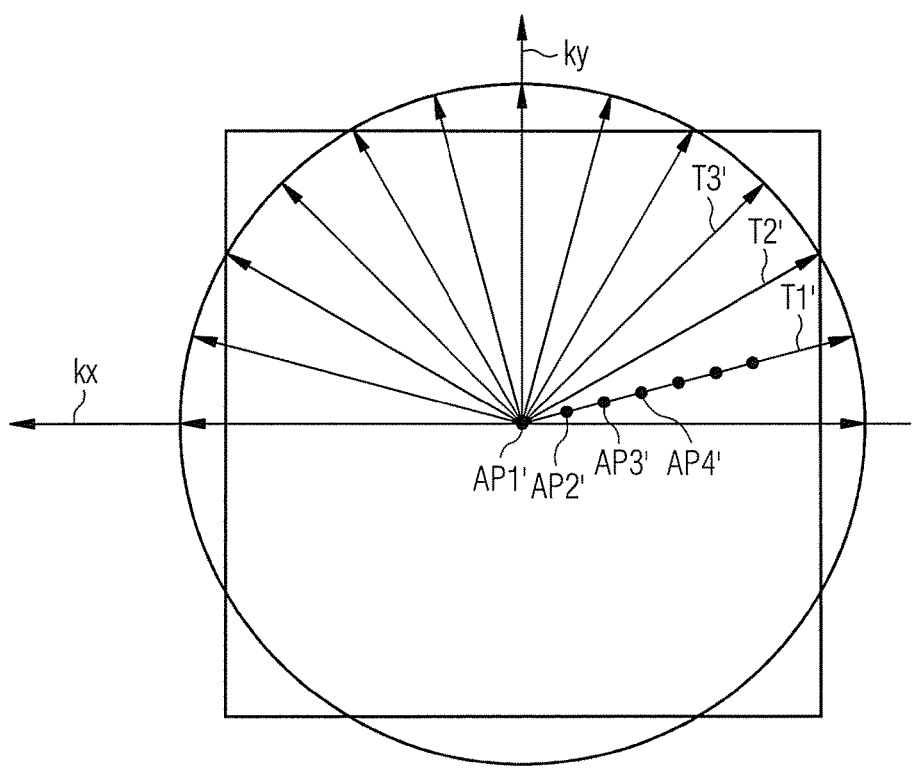
FIG. 2 illustrates the scanning of k-space for readout points that are associated with a first magnetic resonance echo signal, with the sequence according to FIG. 1.

FIG. 2 shows the scanning of (entry of data into) k-space during the acquisition of the first magnetic resonance echo signal $E_1$. The scanning of a slice of the examination subject thereby takes place along multiple trajectories T1, T2, T3. The scanning along the trajectories T1, T2, T3 respectively takes place with a sequence as it is shown in FIG. 1 (limited to the acquisition of the first magnetic resonance echo signal), wherein the slice runs in the kx-direction and ky-direction, as an example.

The first magnetic resonance echo signal is thereby scanned in the form of half projections, wherein for each of the trajectories T1, T2, T3 an excitation signal is first emitted and then the first magnetic resonance echo signal is scanned (as described with regard to FIG. 1) in the form of multiple readout points AP1', AP2', AP3', AP4' that extend in a time curve (starting from the k-space center) up a maximum k-space value (i.e. with maximum magnitude of the k-value for the half projection).

As is apparent from FIG. 1, one consequence of the measurement of these ultrashort echo times is that, in many cases, a possible maximum measurement value $M_{Max}'$ of the first magnetic resonance echo signal $E_1$ is detected incorrectly, or not at all. This means that no measurement values at all are acquired at a possible maximum point of the respective trajectory, such that an actual acquired readout point that has a maximum measurement value $M_{MAX}$ of the magnetic resonance echo signal $E_1$, $E_2$ is associated with a k-space point that is strongly shifted relative to the k-space center. This leads to extremely severe image artifacts. For example, if measurement values of the second magnetic resonance echo signal $E_2$ are also considered for the correction of the switching lag dk, a correlation of the measurement values of the first and second magnetic resonance echo signal is only possible with difficulty, in particular due to the absence of acquisition of all possible readout points, and in particular the absence of acquisition of a maximum possible measurement value of the first magnetic resonance echo signal $E_1$. An exact calculation of displacement values is thus rejected.

In order to prevent this, according to the invention a distinct modification of the control sequence according to the prior art is proposed. This modification is presented in a time curve in FIG. 3. Details regarding the scanning of k-space are explained in detail in the following, in particular in connection with FIGS. 4, 5 and 6. The presentation and the reference characters in FIGS. 3 and 4 correspond to those of FIGS. 1 and 2. Relative to the prior art, the control sequence is modified in that the gradient magnetic field is now already activated before the expected echo time TE1, and what is known as a dephasing is implemented. In this case, the beginning of the switching of the gradient magnetic field G—i.e. the chronological beginning to of the variation of a gradient magnetic field value GA—takes place before the expected echo time TE1 of the first magnetic resonance echo signal E1, such that an expected switching lag dk of the switching of the gradient magnetic field is less than the difference between t0 and TE1. For example, values for an expected switching lag can be provided by the manufacturer of a magnetic resonance imaging system. The magnetic field value GA is initially selected so that a scanning of k-space takes place counter to the direction of the scanning of the half projection in which the first magnetic resonance echo signal $E_1$ should be detected.

As an example of this, the magnetic field value GA is initially decreased starting from zero. The magnetic field value GA is subsequently increased again so that it reaches its initial value of zero again. After this second zero crossing, a polarity change of the magnetic field value GA takes place so that a gradient moment (calculated from the point in time t0) reduces in magnitude, and a reversal of the direction of the trajectory takes place in k-space. The trajectory thus includes regions that are scanned repeatedly in k-space. These regions are scanned twice, chronologically speaking, at least in part before the occurrence of the first magnetic resonance echo signal $E_1$ (thus before the expected echo time TE1).

As is apparent, in spite of the occurrence of the switching lag dk (which is drawn as in FIG. 1 for comparison purposes) the gradient magnetic field G is activated while a maximum value of the first magnetic resonance echo signal E1 occurs, such that magnetic resonance measurement signals that can be associated with the readout points AP1, AP2, AP3 can be detected as of the point in time $t_{xr}$. In reality, the switching lag naturally occurs at the first activation of the gradient magnetic field G. The readout points AP1, AP2, AP3 thus have a maximum value $M_{Max}$ of the first magnetic resonance echo signal E1. As in the prior art, the scanning of the trajectory is subsequently continued so that a half projection up to the edge of k-space $k_{MAX}$ is acquired.

If a reversal of the polarity of the gradient magnetic field value GA subsequently takes place, the scanning of k-space takes place with a second direction reversal along a trajectory. A second magnetic resonance signal $E_2$ which was generated due to the magnetic resonance excitation signal TXP falls in this time period after the second direction reversal. This second magnetic resonance excitation signal TXP is acquired with a trajectory segment that proceeds radially from an edge of k-space with maximum k-value $k_{MAX}$ to an opposite edge of k-space with minimum k-value $-k_{MAX}$. This means that the magnitudes of the coordinates kMAX and −kMAX correspond to one another, while this is not the case for the starting points of the half projection with the region of the pre-dephasing. As is likewise explained with regard to FIG. 1, a spoiler pulse $G_{sp}$ follows after with which the magnetization that was generated by the excitation pulse TXP is neutralized.

Figure 3:
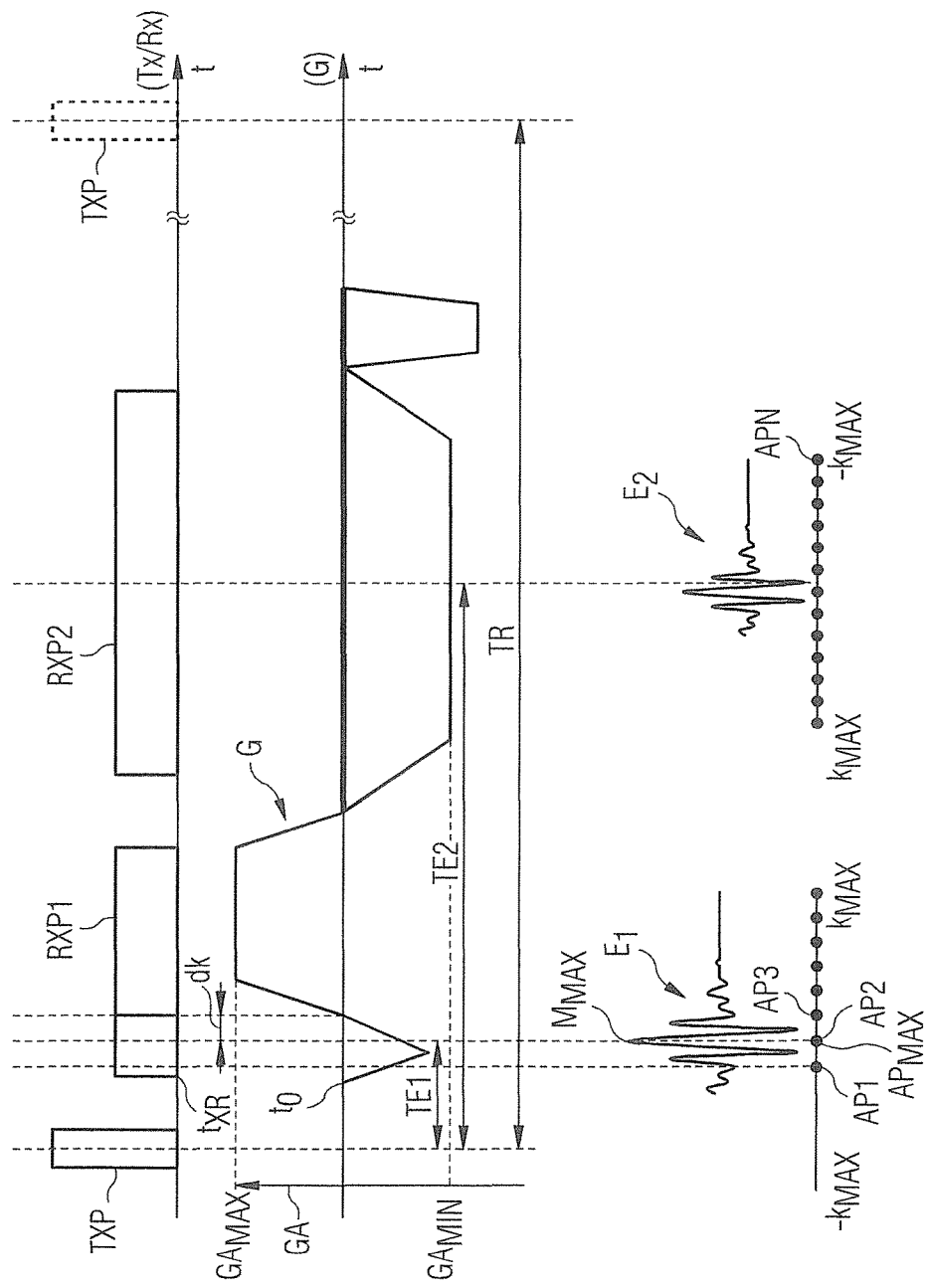
FIG. 3 is a schematic sequence diagram for an exemplary embodiment of a modified UTE sequence according to the invention.
Figure 4:
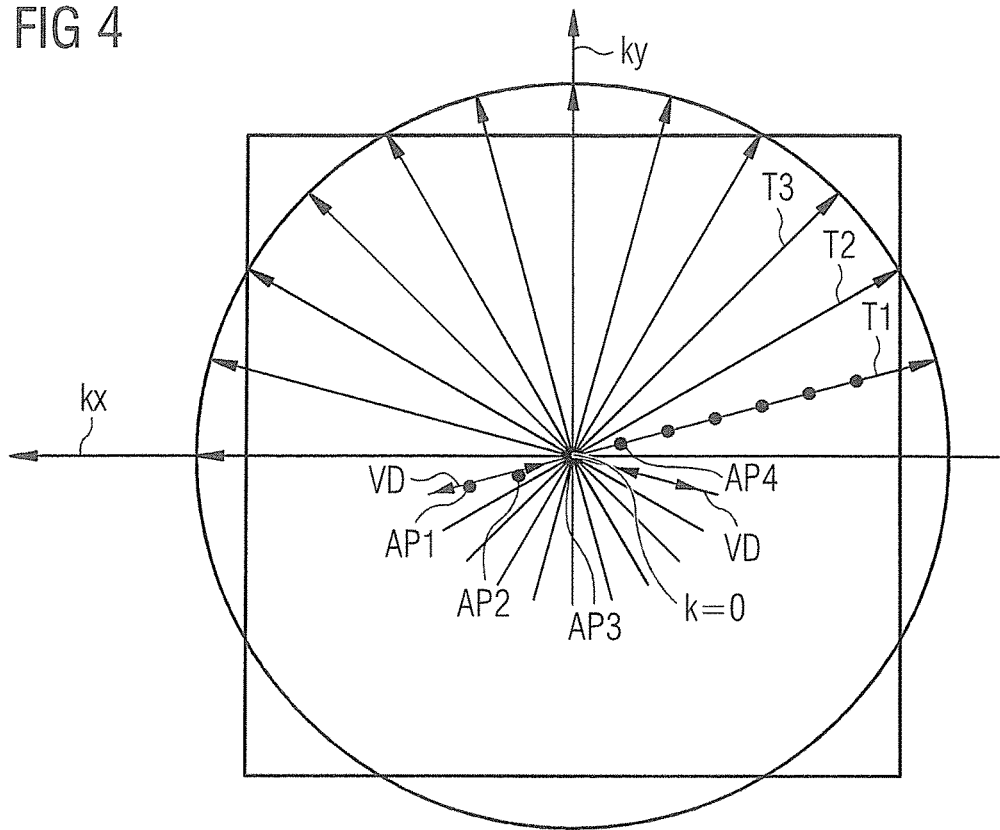
FIG. 4 illustrates the scanning of k-space for readout points that are associated with a first magnetic resonance echo signal, with the sequence according to FIG. 3.

FIG. 4 shows the scanning of k-space for the first magnetic resonance echo signal $E_1$ in detail. Multiple trajectories T1, T2, T3 are thereby shown that respectively scan k-space with a control of a magnetic field value as explained with regard to FIG. 3. For example, with the use of a pre-dephasing VD, the trajectory T1 is initially scanned in the negative kx-direction, while the majority of the half projection is scanned in the positive kx-direction after a reversal of the direction of the trajectory in k-space. The first readout point is thereby acquired in negative kx values, as is depicted in FIG. 3 and clarified in FIG. 4. Following afterward is a direction reversal of the trajectory T1 that follows the direction of the radial half projection and again returns back to the k-space origin point. Relative to the prior art described in FIG. 1, this region can thus be described as a pre-dephasing region of the trajectory that is traversed multiple times before the end of the time period TE1, meaning that the expected echo time TE1 is reached. As described above with regard to FIG. 1, after this the first magnetic resonance echo signal E1 is acquired while scanning k-space up to the edge of k-space in the positive kx-direction.

The acquisition of a half projection in this manner on the one hand ensures that the measurement value of the first magnetic resonance echo signal can be associated in a dedicated manner with the k-space center, since the activation of the gradient magnetic field takes place so early that a maximum point of the first magnetic resonance echo signal can be acquired that corresponds to a maximum possible measurement value of the first magnetic resonance echo signal. For example, this is indicated as an example in FIG. 3 by the maximum point $AP_{max}$ corresponding to the readout point AP2. Moreover, in this exemplary embodiment half projections are likewise acquired, so that it can be assumed that no additional artifacts arise due to the modified scanning of k-space.

Figure 5:
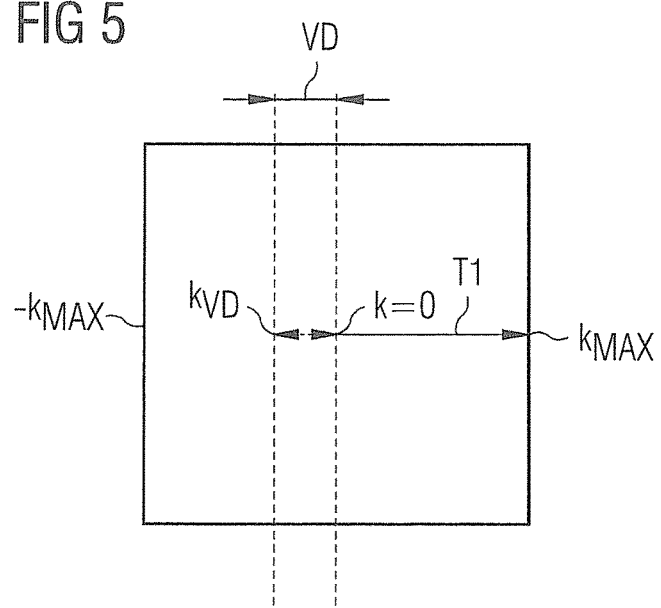
FIG. 5 is an exemplary embodiment of the scanning of k-space with a single trajectory according to the invention.

FIG. 5 shows the scanning of k-space, again as example, in detail for a trajectory T1. The region of the pre-dephasing VD extends to a small part of the length of the half projection in k-space. As is apparent overall, the region of the pre-dephasing VD—i.e. the region that is scanned multiple times in k-space and extends outside of the half projection from the k-space center up to an extreme (here minimum) k-space value $k_{VD}$ of the trajectory T1—is smaller than 25% of the readout length of the trajectory T1 in k-space or, respectively, the half projection in k-space. This means that the length of the region VD corresponds to less than a quarter of the region from the k-space center k=0 up to a maximum k-space value $k_{MAX}$ of the half projection.

This has the advantage that this slight pre-dephasing VD can be implemented so that the acquisition of a maximum measurement value $M_{MAX}$ can fall in the region of the half projection from k=0 to $k_{MAX}$. This is explained further in connection with FIG. 6.

Figure 6:
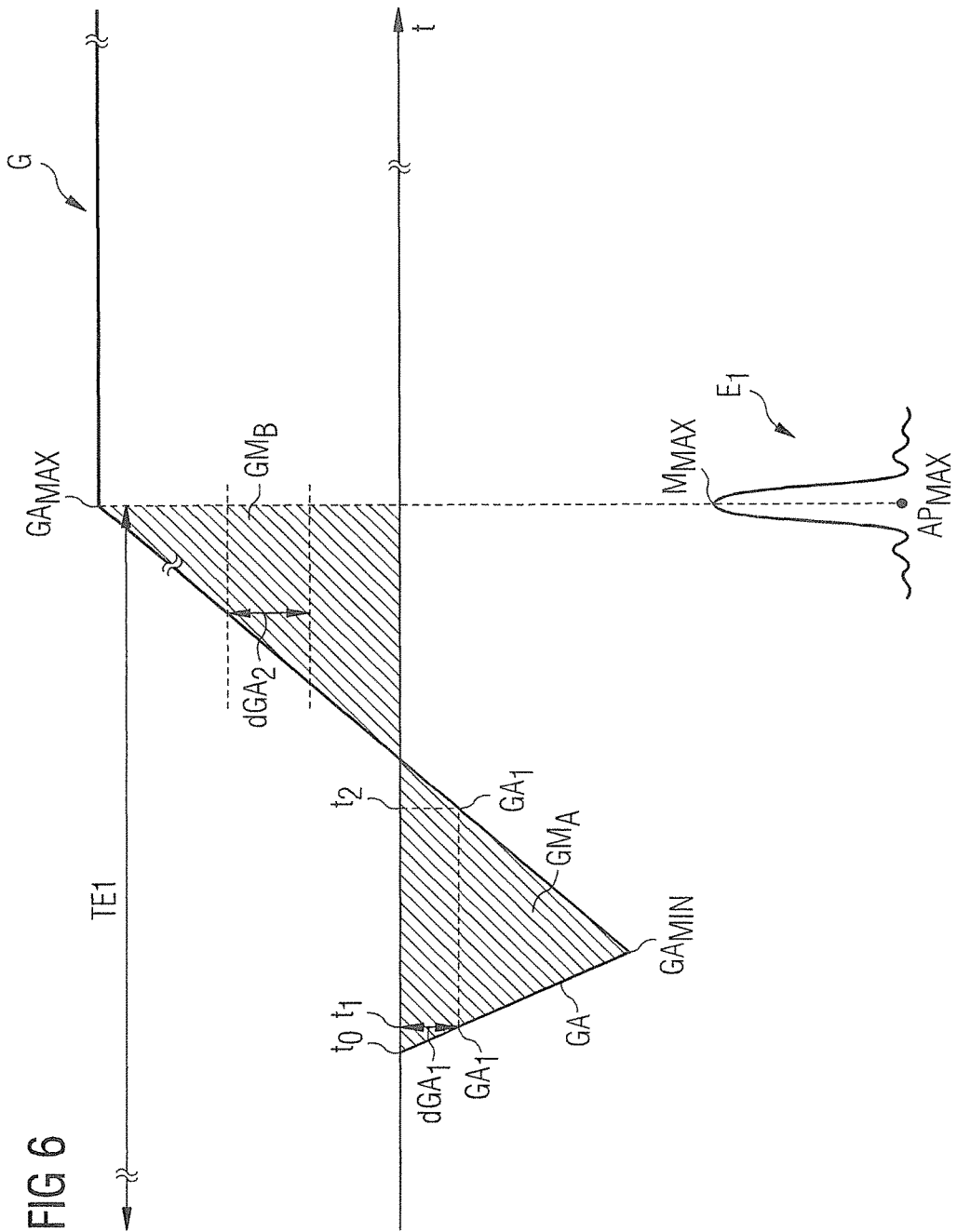
FIG. 6 is a further exemplary embodiment of the invention in a section of a schematic sequence diagram which shows the application of typical values for the switching lag in a UTE control sequence.

In contrast to FIG. 3, in the exemplary embodiment of FIG. 6 the pre-dephasing is selected so that the achievement of a maximum measurement value $M_{MAX}$ of the first magnetic resonance echo signal $E_1$ approximately coincides with the achievement of a maximum magnetic field value $GA_{MAX}$. This means that it is ensured that the expected echo time TE1 of the first magnetic resonance echo signal $E_1$ essentially coincides with the first occurrence of the extreme value $GA_{MAX}$. The first occurrence of the extreme value $GA_{MAX}$ is thereby predicted by an estimation of a typical switching lag. The estimation can thereby be so conservative that the point in time TE1 safely lies after the achievement of the maximum value $GA_{MAX}$. This means that "essentially" in this case indicates that the extreme value lies 2 μs before the expected echo time TE1, for example. As explained, the magnetic field value GA is varied for the first time at the point in time $t_0$. Starting from the first zero crossing at $t_0$, a variation up to a minimum magnetic field value $GA_{MIN}$ (which in particular represents a local minimum) takes place with a constant rate of change of the magnetic field value dGA1. A first magnetic field value GA1 is achieved at a point in time $t_1$ in the course of this variation. Starting from the local minimum value $GA_{MIN}$, the magnetic field value GA is again increased up to a second zero crossing, again with a different constant rate of change dGA2. The first magnetic field value GA1 is thereby achieved again at the second point in time t2, meaning that the minimum magnetic field value $GA_{min}$ represents a turning point in the course of the magnetic field value GA. Between the two zero crossings, a gradient moment $GM_A$ is generated which has a first polarity (a negative polarity in the example) in the presented exemplary embodiment. The change of the gradient magnetic field value GA is continued (here with the constant rate of change dGA2) as of the second zero crossing up to the achievement of the maximum gradient magnetic field value $GA_{MAX}$. In the region between the second zero crossing and the first achievement of the maximum gradient magnetic field value GAmax, the gradient magnetic field generates a gradient magnetic field moment $GM_B$ which has a polarity that is different than that of the gradient magnetic field moment $GM_A$ (thus a positive polarity in the exemplary embodiment). This means that a direction reversal in the scanning of the trajectory takes place at the second zero crossing of the gradient magnetic field value GA. The gradient moment as of the point in time $t_0$ is selected so that this is zero until the maximum gradient magnetic field value $GA_{MAX}$ is reached. This means that the zero point of k-space is in particular achieved when no additional variation of the gradient magnetic field is required to read out the first magnetic resonance echo signal $E_1$ in order to scan the half projection to acquire the first magnetic resonance echo signal $E_1$. This offers the advantage that no additional eddy currents that negatively affect a precise determination of the k-value occur during the acquisition of the first magnetic resonance echo signal $E_1$. In this case, it is particularly advantageous that—as mentioned—the occurrence of a maximum measurement value $M_{MAX}$ of the first magnetic resonance echo signal $E_1$ also coincides with the chronologically first occurrence of the maximum magnetic field value $GA_{MAX}$. This means that the readout point of the maximum measurement value $M_{MAX}$ can be determined particularly precisely without a detectable influence of eddy currents. It is thus possible to obtain measurement values of a first maximum value $M_{MAX}$ that are used particularly well to determine a displacement value for readout points on the trajectory.

This is explained in detail in the following using FIGS. 7 and 8.

Figure 7:
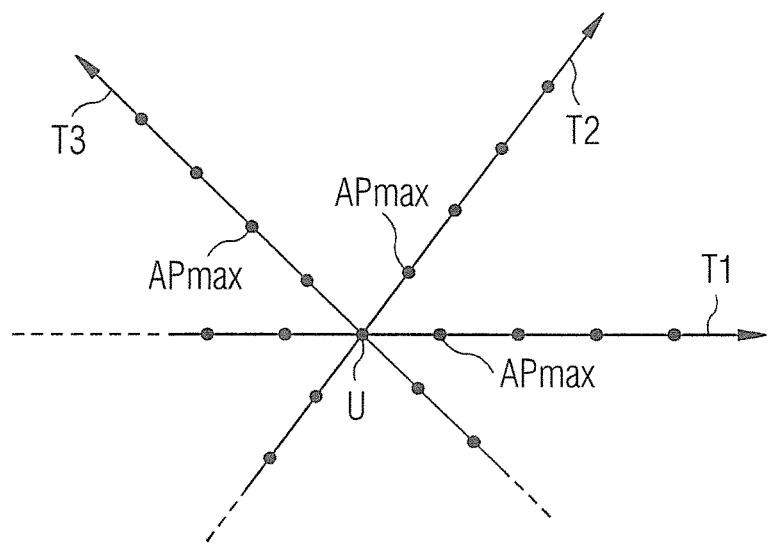
FIG. 7 is an exemplary embodiment of the calculation of a displacement value for multiple trajectories.
Figure 8:
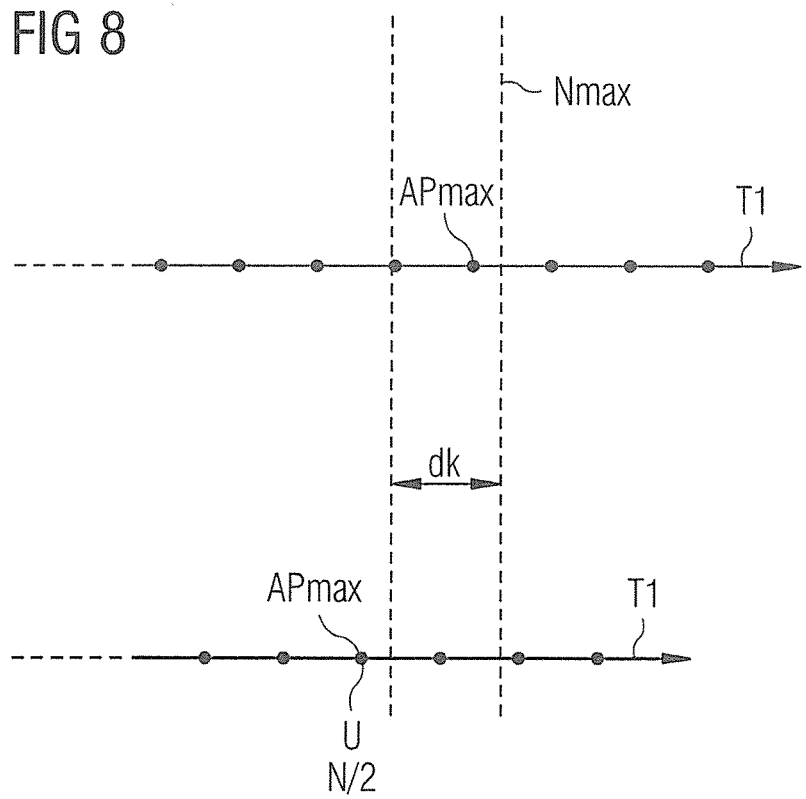
FIG. 8 is an exemplary embodiment of the correction of readout points.

For this, FIGS. 7 and 8 show the calculation of the displacement value dk on the basis of a mean value. A mean value $N_{max}$ is calculated from the count values of the maximum points $AP_{max}$ of the family of projections that (as described) represent a relative measure with regard to the start point of the trajectory, which mean value $N_{max}$ then describes a relative average position of the maximum point relative to the respective start point of the associated projection.

As an example, three half projections T1, T2, T3 modified according the invention are presented in FIG. 7, on the basis of which the calculation of the displacement value dk can take place. For each of the projections T1, T2, T3, a maximum point $AP_{max}$ is determined in the form of a count value, wherein the count values of the maximum point $AP_{max}$ here respectively have the values 4, 4 and 5 for the projections T1, T2, T3. A "count value" here is the relative position of the respective readout point via counting of the readout points along the appertaining trajectory—starting from a "start point"—from the first readout point on the appertaining trajectory, in particular in a defined passage direction in k-space of the trajectory. If count values are relied upon to determine the displacement value dk, it is reasonable to consider count values starting from a start point that lies in a segment of the trajectory in which a target point is approached without a reversal of direction of the trajectory.

Here a target point U is described accordingly by counting of readout points along the depicted trajectory through k-space, such that the target point U can be established by an expected count value for the k-space center under consideration of the pre-dephasing. For example, in the exemplary embodiment the target point U can have a count value of 3. In this case, the readout points AP1, AP2, . . . , APN of the depicted trajectory can be arranged following one another with a fixed spacing on the trajectory. In the following, this is assumed for all trajectories.

The mean value $N_{max}$ (which describes a mean count value of the maximum points $AP_{max}$) is thereby calculated from a mean value of these count values and amounts to $(4+4+5)/3=4\frac{1}{3}$.

At this point, it is to be emphasized that other relative measures with regard to the readout points (in particular the start point) of a trajectory can also be used as an alternative or in addition to the count values in order to define points on a trajectory between the readout points, for example. Among other things, as in the example of the mean value of the maximum points $AP_{max}$ fractions of the spacing of readout points can also be used as relative measures or, respectively, relative positions on the projection or, respectively, trajectory in order form a continuous relative measure. For example, a normalized magnitude of the gradient magnetic field along the trajectory or the like can also be assumed as an alternative relative measure.

The shift value dk is subsequently calculated by taking the difference of the mean value $N_{max}$ from the target point U. An example of this is explained in FIG. 8 for the projection T1. The projection T1 presented in the upper region of FIG. 8 thereby represents raw magnetic resonance data that have an incorrect association of measurement values due to the switching lag. For the presented projection T1, the switching dilatation (described as a count value) amounts to +1, as can easily be established using the maximum point $AP_{max}$, which is shifted from an expected count value at 3 to a real count value of 4. The displacement value dk—thus the difference from the mean value $N_{max}$ to the target point U—with which the count value 3 is associated and which corresponds to the k-space center amounts in this case to $$dk=3-N\max=-4/3.$$

This difference is associated with the displacement value dk, such that this is established in fractions of the intervals of the readout points of the respective trajectory.

In a subsequent step, the readout points of the raw magnetic resonance data are shifted by the shift value dk, as this can be seen as an example in the projection T1 depicted in the lower region of FIG. 8. The shift by the previously described difference −4/3 henceforth associates a relative measurement of −⅓ with the maximum point APmax. A marked improvement of the association of measurement values with readout points can be seen. In the schematic presentation and calculation (limited to only three projections), the small remaining deviation of −⅓ relative to a deviation of +1 before the displacement by dk already means an improvement by 60% for the shown projection T1. In the realization, the method can mean an even more notable advantage relative to the schematic calculation in the association of measurement values with spatial frequencies, for example if the calculation of the mean value is expanded to a larger cohort of projections.

Alternatively, the shift value dk can also be determined using a single trajectory.

Due to the establishment of the shift value dk as a relative measurement, the shift value dk can be applied without modification to all projections, such that from now on the readout points of all projections are displaced by the determined shift value dk. Insofar as only one shift should take place in the spacing of the readout points, the shift value can also be rounded to the nearest whole number.

In an alternative variant, it is conceivable to calculate the difference individually, dependent on the trajectory between the target point U and the maximum point APmax, and to establish an individual, trajectory-dependent shift value dk on the basis of this difference.

Due to the previously described switching lag, k-space points can appear adjacent or separated although they correspond to a single point in k-space. The mentioned gridding method is thus severely plagued with errors, such that a correction of the switching lag by the shift value dk takes place before or during the gridding method, thus before or during the filling of k-space.

In the aforementioned exemplary embodiment, the method is automatically applied after the acquisition of a predetermined cohort of projections (thus before the aforesaid gridding method), in particular in order to realize a time savings. Alternatively, the shift value dk can be taken into account in an algorithm of the gridding method so that the shift takes place during the gridding method. This offers the advantage that three-dimensional reconstructed magnetic resonance image data can also be particularly easily improved with the method.

Figure 9:
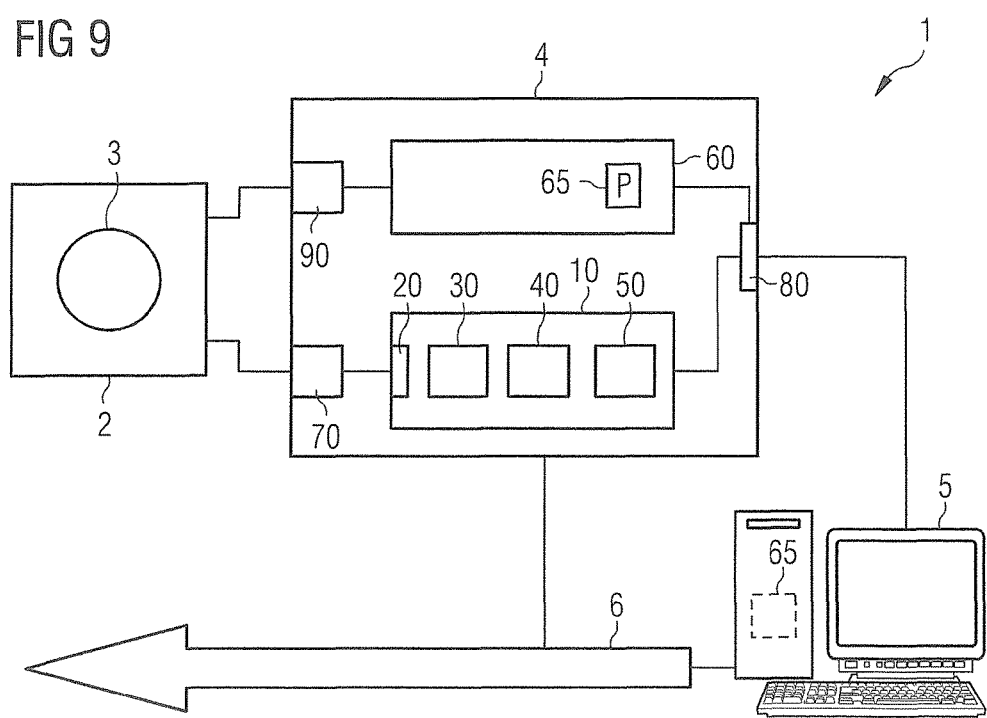
FIG. 9 illustrates a magnetic resonance imaging sequence according to the invention.

Finally, a magnetic resonance imaging system 1 (MR system in the following) is schematically depicted with a reconstruction device 10 in FIG. 9.

The MR system 1 has a typical MR scanner 2 in which is accommodated a patient bed in an examination tunnel 3, on which patient bed an examination subject (a patient or test subject, for example; not shown) can be positioned.

The scanner 2, as well as the patient bed, is controlled by a control device 4. This can hereby be a typical central control computer. This is equipped with a corresponding control interface 90 as well as a measurement control unit 60. This measurement control unit 60 controls the scanner 2 according to a predetermined measurement protocol to implement a measurement.

The control interface 90 here is represented only as a block. However, it is apparent that, in a medical technology system, this interface 90 normally comprises a plurality of individual interfaces. Belonging among these are, for example, interfaces to control the gradient system, a radio-frequency transmission system to emit the radio-frequency pulses etc. Furthermore, this control interface 90 also comprises an interface in order to pass control signals to the patient bed.

The raw MR data acquired from the scanner 2 are passed via a reception interface 70 to the control computer 10. This interface 70 can also comprise multiple sub-interfaces. The raw data are then passed to the reconstruction device 10, which reconstructs image data from these in the manner according to the invention as explained above, which image data are then—for example—displayed on a monitor of a terminal 5 on site and/or stored in a memory device 65 and/or are passed via a network interface to a data bus 6 via which the imaging system 1 is connected with other devices within a network in order to store measurement data or finished reconstructed image data in large mass storage systems, for example, or to send them to finding stations or the like.

The control of the entire MR system 1 by an operator takes place via a terminal 5 which is connected with the central computer unit 10 via a terminal interface 80. For example, with the aid of this terminal 5 and a user interface realized there it is possible that the operator selects a measurement protocol P according to the invention from a memory device 65, adapts it as necessary, and ensures that the measurement control unit 60 outputs corresponding control signals on the basis of this protocol P to the scanner 2 via the control interface 90, such that the measurement can be implemented according to the invention.

As noted, the raw data acquired by the scanner 2 are passed to the reconstruction device 10 via the raw data interface 20.

Furthermore, here the reconstruction device 10 has a shift value determination unit 30 that is designed to determine the displacement value dk according to the method according to the invention.

Moreover, the reconstruction unit 10 has a correction unit 40 to displace the raw data by the displacement value dk.

The reconstruction device 10 also comprises a reconstruction unit 50 that is designed to reconstruct the magnetic resonance image data on the basis of the corrected raw data.

The central control unit 4 does not necessarily need to be designed as an integral unit (as shown here); rather, it can also be formed from many separate units which are networked among one another in a suitable manner. A number of the components can also be realized in the form of software on suitable microcontrollers. This in particular applies to the displacement value determination unit 30, the correction unit 40 and the reconstruction unit 50 or, respectively, its sub-modules. It can as necessary be realized together with additional components on one or more computers (microcontrollers, for example) that belong to the control unit 4. Alternatively, however, these components can also be designed as software modules of a superordinate reconstruction software module. The reconstruction device 10 (or individual components) is preferably designed so that the correction method is integrated into the algorithm of the gridding method.

According to the invention, the reconstruction device 10 can also exist outside of such a central control unit to control the scanner 2. In this case, for example, the raw data are passed directly via a network to the reconstruction device 10. In particular, the image reconstruction device can be part of the terminal 5 insofar as this has a suitable computing capacity.

It is also noted that the central control device 4 and the scanner can have a plurality of additional components that a magnetic resonance system typically have [sic]. However, all of these components, as well as the fundamental functionality of such imaging systems, are known to the man skilled in the art and therefore do not need to be explained in detail here.

The method, the reconstruction unit and the magnetic resonance imaging systems that are described in detail in the preceding are exemplary embodiments that can be modified by those skilled in the art without departing the scope of the invention. For example, the method can also be applied to raw data that describe an examination subject in three dimensions, such that in particular a mean value calculation or a difference calculation takes place in three-dimensional k-space. This can preferably be taken into account in the filling of three-dimensional k-space with virtual raw magnetic resonance data, for example in that common reference points or, respectively, reference values and/or target points U for multiple scanned planes of three-dimensional k-space are also established. Furthermore, it is noted that the features of all exemplary embodiments (or developments described in the figures) can be used in arbitrary combinations.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to generate a magnetic resonance image of an examination subject, comprising:
    operating a magnetic resonance data acquisition unit to radiate a radio-frequency (RF) excitation pulse that excites nuclear spins in an examination subject, thereby causing said nuclear spins to emit chronologically successive magnetic resonance echo signals;
    operating said magnetic resonance data acquisition unit to acquire raw magnetic resonance data from the examination subject, including raw magnetic resonance data of a chronologically first of said magnetic resonance echo signals, during activation of a gradient magnetic field, having a magnetic field value, in said magnetic resonance data acquisition unit;
    entering said raw magnetic resonance data of said chronologically first of said magnetic resonance echo signals into an electronic memory organized as k-space at a plurality of data entry points along a trajectory in k-space having a trajectory path that is established by said magnetic field value of said gradient magnetic field;
    operating said magnetic resonance data acquisition unit to activate said gradient magnetic field with a first magnetic field value at a first point in time in said trajectory path, and subsequently modifying said magnetic field Value relative to said first magnetic field value, and at a later second point in time again giving said gradient magnetic field said first magnetic field value, said second point in time being before or during acquisition of said raw magnetic resonance data of said chronologically first of said magnetic resonance echo signals;
    in a processor having access to said memory, automatically determining a shift value for said trajectory from respective values of said raw magnetic resonance data entered at data entry points along said trajectory path;
    from said processor, shifting said read out points by said shift value along said trajectory path, thereby producing shifted raw magnetic resonance data; and
    in said processor, reconstructing an image of the examination subject from the shifted raw magnetic resonance data, and making the reconstructed image available at an output of the processor as an image data file.

2. A method as claimed in claim 1 comprising entering said raw magnetic resonance data into k-space along said trajectory in a segment of said trajectory that is traversed multiple times before or during said acquisition of said raw magnetic resonance data of said chronologically first of said magnetic resonance echo signals.

3. A method as claimed in claim 1 comprising, after modifying said magnetic field value of said gradient magnetic field, operating said magnetic resonance data acquisition unit to activate said gradient magnetic field with a gradient moment that is zero before or during the acquisition of said raw magnetic resonance data of said chronologically first of said magnetic resonance echo signals.

4. A method as claimed in claim 3 comprising operating said magnetic resonance data acquisition unit to activate said magnetic gradient field to give said gradient magnetic field said gradient moment of zero upon said gradient magnetic field reaching an extreme value of said magnetic field value.

5. A method as claimed in claim 4 comprising operating said magnetic resonance data acquisition unit to activate said magnetic field gradient to give said magnetic field value a rate of change after said second point in time that is constant until said magnetic field value of said gradient magnetic field reaches said extreme value.

6. A method as claimed in claim 1 comprise of operating said magnetic resonance data acquisition unit to activate said gradient magnetic field with said magnetic field value having a rate of change that is constant up to or during acquisition of said raw magnetic resonance data of said chronologically first of said magnetic resonance echo signals.

7. A method as claimed in claim 1 comprising operating said magnetic resonance data acquisition unit to activate said gradient magnetic field with said magnetic field value, during acquisition of said raw magnetic resonance data of said chronologically first of said magnetic resonance echo signals, corresponding to the magnetic field value during acquisition of an extreme value of said raw magnetic resonance data of said chronologically first of said magnetic resonance echo signals.

8. A method as claimed in claim 1 comprising beginning acquisition of the raw magnetic resonance data entered along said trajectory chronologically at or after said magnetic field value of said gradient magnetic field reaches an extreme value.

9. A method as claimed in claim 1 comprising giving said trajectory a length in k-space from said first point in time until said second point in time that was at most 25 percent of a length of said trajectory up to a maximum k-space value of a point on said trajectory.

10. A method as claimed in claim 1 comprising giving said trajectory a length in k-space from said first point in time until said second point in time that was at most 10 percent of a length of said trajectory up to a maximum k-space value of a point on said trajectory.

11. A method as claimed in claim 1 comprising, in said processor, determining a maximum point on said trajectory that has a maximum value of said raw magnetic resonance data, and determining said shift value based on said maximum point.

12. A method comprising operating said magnetic resonance data acquisition unit to radiate said RF pulse, acquire said raw magnetic resonance data, and determine said shift value for a family of trajectories in k-space, and determining said shift value from raw magnetic resonance data entered along said family of trajectories.

13. A method as claimed in claim 11 comprising, for at least one of the trajectories in said family, determining said shift value from a combination of respective maximum points of the respected trajectories in said family, each maximum point having a maximum value of said raw magnetic resonance data along that respective trajectory, and from another point in time along that respective trajectory.

14. A magnetic resonance imaging apparatus, comprising:
a magnetic resonance data acquisition unit;
a control unit configure to operate the magnetic resonance data acquisition unit to radiate a radio-frequency (RF) excitation pulse that excites nuclear spins in an examination subject, thereby causing said nuclear spins to emit chronologically successive magnetic resonance echo signals;
said control unit being configured to operate said magnetic resonance data acquisition unit to acquire raw magnetic resonance data from the examination subject, including raw magnetic resonance data of a chronologically first of said magnetic resonance echo signals, during activation of a gradient magnetic field, having a magnetic field value, in said magnetic resonance data acquisition unit;
said control unit being configured to enter said raw magnetic resonance data of said chronologically first of said magnetic resonance echo signals into said electronic memory organized as k-space at a plurality of data entry points along a trajectory in k-space having a trajectory path that is established by said magnetic field value of said gradient magnetic field;
said control unit being configured to operate said magnetic resonance data acquisition unit to activate said gradient magnetic field with a first magnetic field value at a first point in time in said trajectory path, and subsequently modifying said magnetic field value relative to said first magnetic field value, and at a later second point in time again giving said gradient magnetic field said first magnetic field value, said second point in time being before or during acquisition of said raw magnetic resonance data of said chronologically first of said magnetic resonance echo signals;
a processor having access to said memory, said processor being configured to automatically determine a shift value for said trajectory from respective values of said raw magnetic resonance data entered at data entry points along said trajectory path;
said processor being configured to shift said read out points by said shift value along said trajectory path, thereby producing shifted raw magnetic resonance data; and
said processor being configured to reconstruct an image of the examination subject from the shifted raw magnetic resonance data, and to make the reconstructed image available at an output of the processor as an image data file.

15. A non-transitory, computer-readable data storage medium encoded with programming instructions, said storage medium being loaded into a computerized control and evaluation system of a magnetic resonance apparatus, that also comprises a magnetic resonance data acquisition unit, said programming instructions causing said computerized control and evaluation system to:
operate said magnetic resonance data acquisition unit to radiate a radio-frequency (RF) excitation pulse that excites nuclear spins in an examination subject, thereby causing said nuclear spins to emit chronologically successive magnetic resonance echo signals;
operate said magnetic resonance data acquisition unit to acquire raw magnetic resonance data from the examination subject, including raw magnetic resonance data of a chronologically first of said magnetic resonance echo signals, during activation of a gradient magnetic field, having a magnetic field value, in said magnetic resonance data acquisition unit;
enter said raw magnetic resonance data of said chronologically first of said magnetic resonance echo signals into an electronic memory organized as k-space at a plurality of data entry points along a trajectory in k-space having a trajectory path that is established by said magnetic field value of said gradient magnetic field;
operate said magnetic resonance data acquisition unit to activate said gradient magnetic field with a first magnetic field value at a first point in time in said trajectory path, and subsequently modifying said magnetic field value relative to said first magnetic field value, and at a later second point in time again giving said gradient magnetic field said first magnetic field value, said second point in time being before or during acquisition of said raw magnetic resonance data of said chronologically first of said magnetic resonance echo signals;

automatically determine a shift value for said trajectory from respective values of said raw magnetic resonance data entered at data entry points along said trajectory path;

shift said read out points by said shift value along said trajectory path, thereby producing shifted raw magnetic resonance data; and reconstruct an image of the examination subject from the shifted raw magnetic resonance data, and make the reconstructed image available at an output of the processor as an image data file.

\* \* \* \* \*